United States Patent
Li et al.

[11] Patent Number: 6,093,946
[45] Date of Patent: Jul. 25, 2000

[54] EEPROM CELL WITH FIELD-EDGELESS TUNNEL WINDOW USING SHALLOW TRENCH ISOLATION PROCESS

[75] Inventors: Xiao-Yu Li; Sunil D. Mehta, both of San Jose, Calif.

[73] Assignee: Vantis Corporation, Sunnyvale, Calif.

[21] Appl. No.: 09/026,814

[22] Filed: Feb. 20, 1998

[51] Int. Cl.$^7$ .................................................. H01L 29/788
[52] U.S. Cl. ........................ 257/318; 257/315; 257/321
[58] Field of Search ...................... 257/314, 315, 257/321, 318; 438/257, 258, 263, 264; 365/185.01, 185.05, 185.09, 185.1

[56] References Cited

U.S. PATENT DOCUMENTS

| | | | |
|---|---|---|---|
| 5,051,795 | 9/1991 | Gill et al. | 257/321 |
| 5,293,331 | 3/1994 | Hart et al. | 257/315 |
| 5,324,972 | 6/1994 | Takebuchi et al. | 257/321 |
| 5,764,569 | 6/1998 | Wright | 365/185.1 |

*Primary Examiner*—Sara Crane
*Attorney, Agent, or Firm*—J. Vincent Tortolano; Davis Chin

[57] ABSTRACT

An improved EEPROM cell having a field-edgeless tunnel window is provided which is fabricated by a STI process so as to produce reliable endurance and data retention. The EEPROM cell includes a floating gate, a programmable junction region, and a tunneling oxide layer separating the programmable junction region and the floating gate. The tunneling oxide layer defines a tunnel window which allows for programming and erasing of the floating gate by tunneling electrons therethrough. The programmable junction region has a width dimension and a length dimension so as to define a first area. The tunnel window has a width dimension and a length dimension so as to define a second area. The second area of the tunnel window is completely confined within the first area of the programmable junction region so as to form a field-edgeless tunnel window.

1 Claim, 2 Drawing Sheets

EEPROM CELL WITH FIELD-EDGELESS TUNNEL WINDOW USING SHALLOW TRENCH ISOLATION PROCESS

BACKGROUND OF THE INVENTION

1. Field of the Invention

This invention relates generally to electrically, erasable programmable read-only memory (EEPROM) cells implemented with a shallow trench isolation (STI) process. More particularly, it relates to an improved EEPROM cell having a field-edgeless tunnel window which is fabricated by a STI process so as to produce reliable endurance and data retention.

2. Description of the Prior Art

As is generally well-known, one type of isolation technology used very extensively in the past for isolating active devices on a high density semiconductor integrated circuit is referred to as "LOCOS" (isolation for local oxidation of silicon). However, as the active device geometries were reduced or shrunk down to deep sub-micron dimensions (<0.25 µm) in the integrated circuit process to achieve higher densities, the effectiveness of the LOCOS isolation technique was significantly degraded. As a consequence, there was developed a newer scalable isolation process referred to as "shallow trench isolation" (STI) in which trenches are etched adjacent active regions of the semiconductor substrate. Nevertheless, the STI technology was not without its own problems, such as adversely affecting the quality of the tunnel oxide at the STI corners thereby reducing the data retention capability of the EEPROM cell.

In fact, it has been determined that EEPROM cells implemented with standard logic STI process have a worse cell endurance/data retention characteristic than the EEPROM cells fabricated using the LOCOS isolation technique. This is caused by the non-rounded corners at the STI edges. One way of overcoming the problem of STI cell data retention in the EEPROM cell is achieved by increasing the liner thickness of the liner oxide layer to approximately 1,000 Å, as is described and illustrated in co-pending application Ser. No. 08/947,888 filed on Oct. 9, 1997, and entitled "Improving Data Retention of EEPROM Cell with Shallow Trench Isolation Using Thicker Liner Oxide." This application Ser. No. 08/947,888 is assigned to the same assignee as in the present invention. By increasing the liner oxide thickness, the isolation structure will not be degraded by the subsequent fabrication etching step which might cause leakage current from the side walls of the trenches.

However, this approach suffers from the disadvantage that it sometimes requires a relatively long period of development so as to modify the existing standard logic STI process in order to obtain the needed data retention characteristic in the EEPROM cell. Therefore, there is still a need for an improved EEPROM cell having a field-edgeless tunnel window without requiring modification to the STI process.

SUMMARY OF THE INVENTION

Accordingly, it is a general object of the present invention to provide an improved EEPROM cell having a field-edgeless tunnel window which overcomes the problems of the prior art.

It is an object of the present invention to provide an improved EEPROM cell having a field-edgeless tunnel window which is fabricated without modification to the STI process.

It is another object of the present invention to provide an improved EEPROM cell which produces reliable endurance and data retention.

It is still another object of the present invention to provide an improved EEPROM cell which includes a tunnel window which is completely confined within the area of an active region so as to form a field-edgeless tunnel window.

It is yet still another object of the present invention to provide an improved EEPROM cell which includes a tunnel window of a smaller size so as to increase the coupling ratio of the cell.

In accordance with a preferred embodiment of the present invention, there is provided an EEPROM cell which includes a floating gate, a program junction region, and a tunneling oxide layer separating the program junction region and the floating gate. The tunneling oxide layer defines a tunnel window which allows for programming and erasing of the floating gate by tunneling electrons therethrough. The program junction region has a width dimension and a length dimension so as to define a first area. The tunnel window has a width dimension and a length dimension so as to define a second area. The floating gate has a width dimension and a length dimension so as to form a third area.

The width dimension of the tunnel window is made less than the width dimension of the program junction region so as to be non-overlapping with the program junction region. The length of the tunnel window is made to be less than the length dimension of the program junction region so as to be confined within the length dimension of the program junction region. The width dimension of the floating gate is made to be less than the length dimension of the tunnel window so that the tunnel window is overlapping the floating gate. The length dimension of the floating gate is made to be larger than the width dimension of the tunnel window so that the floating gate is overlapping the tunnel window. As a result, the second area of the tunnel window is completely confined within the first area of the program junction region so as to form a field-edgeless tunnel window.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Before describing in detail the improved EEPROM cell with a field-edgeless tunnel window of the present invention, it is believed that it would be helpful in understanding the principles of the present invention and to serve as a background by first explaining the structure of the conventional EEPROM cell with its tunnel window with reference to FIGS. 1 through 5. Therefore, the conventional EEPROM cell structure will now be explained and the problems associated therewith.

Figure 1:
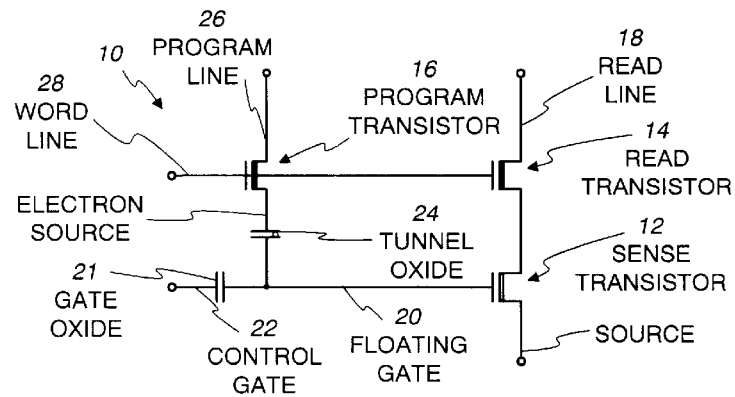
FIG. 1 is a schematic circuit diagram of a conventional EEPROM cell.
Figure 2:
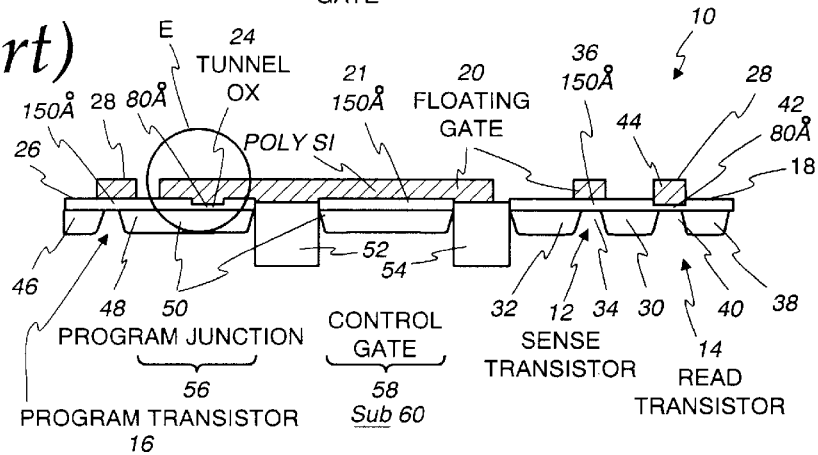
FIG. 2 is a cross-sectional view of the EEPROM cell of FIG. 1 in which a standard logic shallow trench isolation process has been employed.
Figure 3:
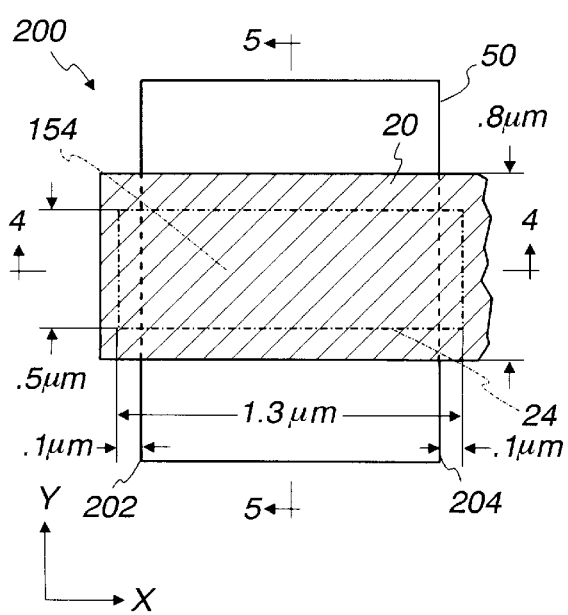
FIG. 3 is an enlarged top plan view of the encircled portion E of FIG. 2, illustration the conventional tunnel window in the EEPROM cell.
Figure 4:
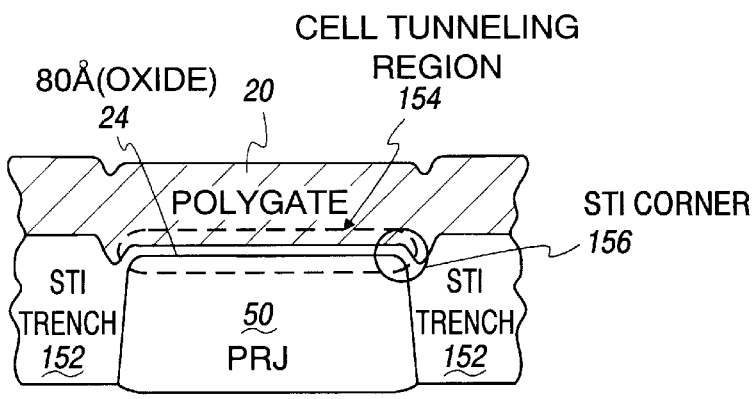
FIG. 4 is a cross-sectional view, taken along the lines 4—4 of FIG. 3.
Figure 5:
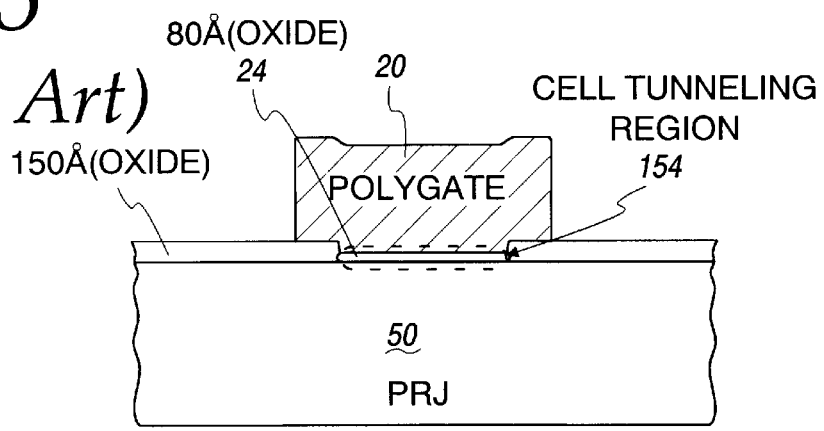
FIG. 5 is a cross-sectional view, taken along the lines 5—5 of FIG. 3.

Initially, there is shown in FIG. 1 a schematic circuit diagram of a conventional EEPROM cell 10. A cross sectional view of the construction of the EEPROM cell structure 10 of FIG. 1 is illustrated in FIG. 2. FIG. 3 is an enlarged, top plan view of the encircled portion E of FIG. 2, which illustrates the layout of the tunnel window in the conventional EEPROM cell 10. FIG. 4 is a cross-sectional view taken along the lines 4—4 of FIG. 3, and FIG. 5 is a cross-sectional view taken along the lines 5—5 of FIG. 3.

As can best be seen from FIG. 1, the EEPROM cell is comprised of a floating gate sense transistor 12, a read transistor 14, and a program or write transistor 16. The read transistor has its drain connected to a Read line 18 and its source connected to the drain of the sense transistor 12. The sense transistor has its floating gate 20 capacitively coupled via a gate oxide 21 to a Control Gate line 22 and also capacitively coupled via a tunneling oxide 24 to the source of the program transistor 16. The program transistor 16 has its drain connected to a Program line 26 and its gate connected to the gate of the read transistor 14 and to a Word line 28.

With reference to FIG. 2, the EEPROM cell 10 is fabricated with the floating gate sense transistor 12 being formed by a N+ drain region 30 and a N+ source region 32, and a channel region 34 disposed between the drain and source regions. A gate oxide layer (approximately 150 Å in thickness) is formed above the channel, and an N-type polycrystalline silicon (poly-Si) floating gate 20 is formed over the gate oxide 36. The read transistor 14 is formed with a N+ drain region 38 and the N+ source region 30 with a channel region 40 disposed therebetween. A gate oxide layer 42 (approximately 80 Å in thickness) and a gate structure 44 are formed over the channel region 40. The program transistor 16 is formed with a N+ drain region 46, a N+ source region 48, and a programmable junction region 50.

The tunneling oxide layer 24 is formed between the programmable junction region 50 (source or the region 48 of the program transistor 16) and the poly-Si floating gate 20. The gate oxide layer 21 is formed between the floating gate 20 and the control gate line 22. The gate oxide layer 21 is approximately 150 Å in thickness. Areas 52 and 54 define isolation regions in which the shallow trench isolation structures will be located. The shallow trench isolation structures formed in the areas 52 and 54 are used to electrically isolate active regions 56 and 58 of the semiconductor substrate 60 from surrounding devices.

As can best be seen from FIGS. 3–5, the tunnel window structure 200 consisting of the tunnel window defined by the tunneling oxide layer 24 has a dimension in the X-direction on the order of 1.3 $\mu$m to 1.5 $\mu$m which overlaps edges 202 and 204 of the active region formed by the programmable junction region 50. It will be noted that STI trenches 152 (FIG. 4) are formed on each side of the programmable junction region 50 so as to electrically isolate the same. It should be further noted that the EEPROM cell is programmed and erased by the tunneling of electrons through the tunnel window. Moreover, the tunnel window 24 has a dimension in the Y-direction of approximately 0.5 $\mu$m. The poly-Si floating gate 20 has a dimension in the Y-direction of about 0.8 $\mu$m and thus overlaps the tunnel window 24. Thus, the tunnel window 24 as presently illustrated is about 1.3 $\mu$m×0.5 $\mu$m, with approximately 0.1 $\mu$m overlap on each side of the active region 50. As a result, the actual size of the tunneling region designated by the dotted line 154 is 1.1 $\mu$m×0.5 $\mu$m. The corners 156 (FIG. 4) at the STI edges will cause problems and degrade the cell data retention.

Therefore, it would be desirable to reduce the size of the tunnel window 24 in the X-direction so as to be completely enclosed within the active region (i.e., as small as 0.5 $\mu$m×0.5 $\mu$m). However, since the tunnel window is typically opened using a wet etch such as hydrochloric acid buffered oxide etch (BOE), it is very difficult to ensure that such a small-size tunnel window can be reliably opened. On the other hand, while it is known that a dry plasma etch may be used to form the small-size tunnel window, it is not acceptable due to the fact that it creates a substantial amount of damage to the tunneling oxide thereby causing degraded cell data retention.

Figure 6:
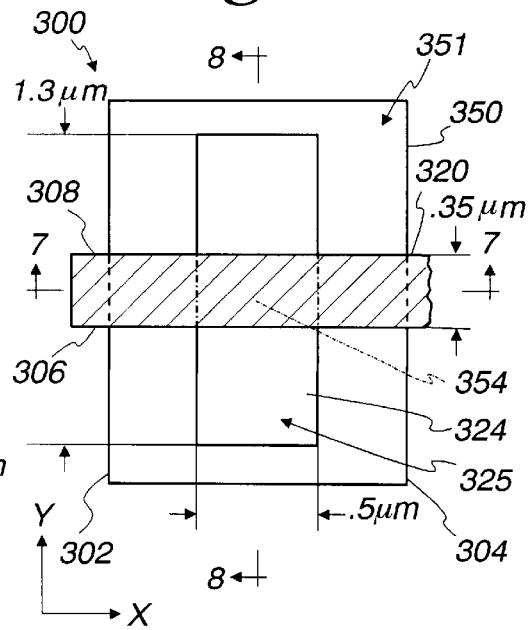
FIG. 6 is an enlarged top plan view similar to FIG. 3, but illustrating the field-edgeless tunnel window constructed in accordance with the principles of the present invention.
Figure 7:
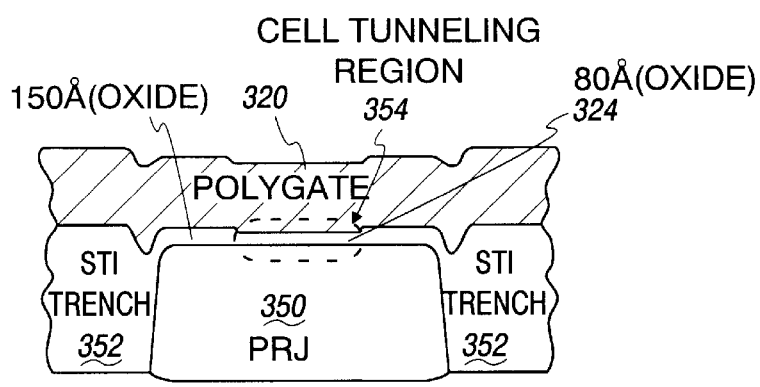
FIG. 7 is a cross-sectional view, taken along the lines 7—7 of FIG. 6.
Figure 8:
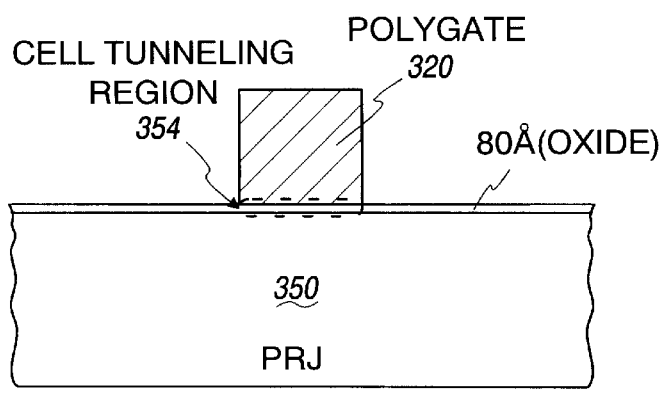
FIG. 8 is a cross-sectional view, taken along the lines 8—8 of FIG. 6.

Therefore, in view of this, the inventors have now discovered a new and improved EEPROM cell which can be fabricated using the standard logic STI process but yet is immune to the STI corner problem. This is achieved in the present invention by fabricating the EEPROM cell to have a field-edgeless tunnel window. The tunnel window structure 300 of the present invention will now be explained with reference to FIGS. 6 through 8.

The tunnel window structure 300 is comprised of a tunnel window defined by the tunneling oxide layer 324 which has a dimension in the X-direction in the range between 0.5 $\mu$m to 1.0 $\mu$m and is preferably about 0.5 $\mu$m. Thus, the dimension in the X-direction of the tunnel window 324 has been reduced in size from the tunneling oxide layer 24 in FIGS. 3–5 so as to be non-overlapping with edges 302, 304 of the active region formed by the programming junction region 350. It will be noted that the STI trenches 352 (FIG. 7) are formed on each side of the programming junction region 350 so as to electrically isolate the same. Again, the tunnel window 324 allows for programming and erasing of the floating gate by tunneling electrons therethrough. Further, the tunnel window 324 has an increased dimension in the Y-direction over the tunnel window 24 of FIGS. 3–5 to be approximately 1.3 $\mu$m. This is to ensure that the tunnel window 324 can be reliably opened when using the wet etching process.

It can be observed that the tunnel window 324 in the Y-direction is self-aligned by the edges 306, 308 defining the width of the poly-Si floating gate 320. Since the width dimension of the floating gate in the Y-direction is scalable, this serves to reduce the cell size. In particular, the floating gate 320 has a dimension in the Y-direction in the range of 0.18 $\mu$m to 0.35 $\mu$m and is most preferably 0.35 $\mu$m.

Consequently, the area 325 of the tunnel window in the preferred embodiment is approximately 0.5 $\mu$m×1.3 $\mu$m, which is completely confined within the area 351 of the programmable junction region 350. As a result, the actual size or area of the tunneling window region designated by the dotted line 354 is 0.5 $\mu$m×0.35 $\mu$m, which is smaller in area than the tunneling region designated by the dotted line 154 in FIG. 3.

As the size or area of the tunnel window is made smaller, the coupling ratio of the cell is increased. Coupling ratio defines what portion of an applied voltage will appear across the tunneling oxide layer. This is, in turn, dependent upon the total capacitance of the cell, which includes the capacitance of the tunnel window, and the coupling ratio is inversely proportional to the total cell capacitance. Therefore, the smaller capacitance of the smaller tunnel window will create a larger coupling ratio. On the other hand, the smaller tunnel window will reduce the tunneling current. Nevertheless, this adverse effect is compensated or offset by the larger coupling ratio. Consequently, the EEPROM cell of the present invention is still easier to program and/or erase.

From the foregoing detailed description, it can thus be seen that the present invention provides an improved EEPROM cell having a field-edgeless tunnel window which can be fabricated by the standard logic STI process so as to produce reliable endurance and data retention. A programmable junction region has a width dimension and a length dimension so as to define a first area. A tunnel window has a width dimension and a length dimension so as to define a second area. The second area of the tunnel window is completely confined within the first area of the programming junction region so as to form a field-edgeless tunnel window. As a result, the EEPROM cell of the present invention is immune from the STI corner problem.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of all claims.

We claim:

1. In an EEPROM cell implemented with a shallow trench isolation (STI) process to produce reliable endurance and data retention, said EEPROM cell including a floating gate, a programmable junction region formed between STI trenches, and a tunneling oxide layer separating said programmable junction region and said floating gate, said tunneling oxide layer defining a tunnel window which allows for programming and erasing of said floating gate by tunneling electrons therethrough, wherein the improvement comprising:

said programmable junction region having a width dimension and a length dimension so as to define a first area;

said tunnel window having a width dimension of approximately 0.5 $\mu$m and a length dimension of approximately 1.3 $\mu$m so as to define a second area;

said floating gate having a width dimension of approximately 0.35 $\mu$m and a length dimension so as to define a third area;

said width dimension of said tunnel window being less than said width dimension of said programmable junction region so that said width dimension of said programmable junction region overlaps said width dimension of said tunnel window;

said length dimension of said tunnel window being less than said length dimension of said programmable junction region so as to be confined within the length dimension of said programmable junction region;

said width dimension of said floating gate being less than said length dimension of said tunnel window so that said length dimension of said tunnel window is overlapping opposed edges of said floating gate by approximately 0.5 $\mu$m;

said length dimension of said floating gate being larger than said width dimension of said tunnel window so that said length dimension of said floating gate is overlapping said width dimension of said tunnel window; and said second area of said tunnel window being completely confined within the first area of said programmable junction region so as to form a field-edgeless tunneling window region having a width dimension of about 0.5 $\mu$m and a length dimension of about 0.35 $\mu$m underneath the third area of said floating gate.

* * * * *